United States Patent [19]
Ishibashi et al.

[11] Patent Number: 5,858,620
[45] Date of Patent: Jan. 12, 1999

[54] SEMICONDUCTOR DEVICE AND METHOD FOR MANUFACTURING THE SAME

[75] Inventors: Takeo Ishibashi; Ayumi Minamide; Toshiyuki Toyoshima, all of Tokyo; Keiichi Katayama, Hyogo, all of Japan

[73] Assignee: Mitsubishi Denki Kabushiki Kaisha, Tokyo, Japan

[21] Appl. No.: 785,846

[22] Filed: Jan. 24, 1997

[30] Foreign Application Priority Data

Jul. 5, 1996 [JP] Japan ................................ 8-176851

[51] Int. Cl.⁶ ........................................................ G03C 5/00
[52] U.S. Cl. .......................... 430/313; 430/312; 430/325; 430/330
[58] Field of Search .................................. 430/312, 325, 430/330, 313

[56] References Cited

U.S. PATENT DOCUMENTS

| | | | |
|---|---|---|---|
| 4,501,806 | 2/1985 | Watanabe et al. | 430/25 |
| 5,324,550 | 6/1994 | Yamaguchi et al. | 427/510 |
| 5,342,727 | 8/1994 | Vicari et al. | 430/157 |
| 5,545,512 | 8/1996 | Nakato | 430/323 |

FOREIGN PATENT DOCUMENTS

| | | |
|---|---|---|
| 4-363014 | 12/1992 | Japan . |
| 5-166717 | 7/1993 | Japan . |
| 5-241348 | 9/1993 | Japan . |
| 6-250379 | 9/1994 | Japan . |
| 7-134422 | 5/1995 | Japan . |

OTHER PUBLICATIONS

German Office Action and English translation thereof.
Characterization of Diazonaphthoquinone–Novolac Resin––Type Positive Photoresist for g–line and i–line Exposure using Water–Soluble Contrast Enhancement Materials, M. Endo et al., May 1989, *Journal of Vacuum Science Technology*, B7 (3), pp. 565–568.
New Water–Soluble Contrast Enhancing Material for I–Line Lithography, M. Endo et al., *Journal of the Electrochemical Society*, vol. 136, No. 2, Feb. 1989, pp. 508–511.
Proceedings of SPIE—The International Society for Optical Engineering , vol. 923, 1988, pp. 158–171.
Proceedings of SPIE—The International Society for Optical Engineering, vol. 1086, 1989, pp. 34–47.

*Primary Examiner*—Janet C. Baxter
*Assistant Examiner*—Rosemary Ashton
*Attorney, Agent, or Firm*—McDermott, Will & Emery

[57] ABSTRACT

A first resist pattern, which is capable of generating an acid, is formed on a semiconductor device layer. Over the first resist pattern, a layer of a second resist, which is capable of undergoing an cross-linking reaction in the presence of an acid, is formed. Then, a cross-linked film is formed in portions of said layer of the second resist at the boundary with said first resist by action of an acid from said first resist. Thereafter, non-cross-linked portions of said second resist are removed to form a finely isolated resist pattern. The semiconductor device layer is etched, via a mask of said finely isolated resist pattern, to form a fine spaces or holes.

31 Claims, 7 Drawing Sheets

SEMICONDUCTOR DEVICE AND METHOD FOR MANUFACTURING THE SAME

TECHNICAL FIELD

The present invention relates to a method for manufacturing a semiconductor device by use of the finely isolated resist patterns, and to a semiconductor device made according to the method. More particularly, this invention relates to a method for forming finely isolated resist patterns wherein an isolation size or an opening size in the pattern is reduced when the resist pattern is formed in a semiconductor manufacturing process.

BACKGROUND ART

The high degree of integration of semiconductor devices is accompanied with very fine interconnections and isolation widths required in manufacturing processes. Fine patterns are typically created by forming a resist pattern according to a photo-lithographic technique and etching various types of underlying thin films via the resist pattern used as a mask.

In this sense, the photo-lithographic technique is very important as a starting point for the fine processing. The photo-lithographic technique includes resist coating, mask alignment, exposure to light and development. This technique limits the fineness due to the restriction imposed on the wavelength of exposing light.

As described above, when using the conventional photo-lithographic technique, it has been difficult to form a fine resist pattern which exceeds the limit of the wavelength.

DISCLOSURE OF THE INVENTION

The present invention provides a method for manufacturing a semiconductor device using the finely isolated resist pattern-reducing technique, and also provides a semiconductor device made according to the method. In particular, the present invention provides a method for forming a finely isolated reduced resist pattern which enables one to form a pattern exceeding the limit of the wavelength.

According to one aspect of the present invention, in a method for manufacturing a semiconductor device, a pattern of a first resist capable of generating an acid on a semiconductor device layer is formed. Over the first resist, a layer of a second resist which is capable of undergoing a cross-linking reaction in the presence of an acid is formed. A cross-linked film is formed in portions of the second resist, which are in contact with the first resist. The cross-linked film is formed by action of an acid from the first resist. Non-cross-linked portions of the second resist are removed to form a resist pattern. Then, the semiconductor device layer is etched via a mask of the resist pattern.

In another aspect of the present invention, in the method for manufacturing a semiconductor device, the pattern of the first resist and the layer of the second resist are heated to form the cross-linked film.

In another aspect of the present invention, in the method for manufacturing a semiconductor device, the pattern of the first resist is formed of a resist capable of generating an acid on exposure to light.

In another aspect of the present invention, in the method for manufacturing a semiconductor device, the pattern of the first resist is selectively exposed to light only in a predetermined area.

In another aspect of the present invention, in the method for manufacturing a semiconductor device, the pattern of the first resist is formed of a resist containing an acid therein.

In another aspect of the present invention, in the method for manufacturing a semiconductor device, the pattern of the first resist is formed of a resist which is surface-treated with an acidic liquid.

In another aspect of the present invention, in the method for manufacturing a semiconductor device, the pattern of the first resist is formed of a mixture comprising a novolac-based resin and a naphtho-quinone diazide photosensitive agent.

In another aspect of the present invention, in the method for manufacturing a semiconductor device, the pattern of the first resist further comprises a chloro-methyl-triazine as an acid generator.

In another aspect of the present invention, in the method for manufacturing a semiconductor device, the pattern of the first resist is formed of a mixture comprising a poly-hydroxy-styrene derivative and an onium salt serving as an photo-assisted acid generator.

In another aspect of the present invention, in the method for manufacturing a semiconductor device according, the layer of the second resist is formed of a resist which comprises a cross-linking agent capable of undergoing cross-linking reaction in the presence of an acid.

In another aspect of the present invention, in the method for manufacturing a semiconductor device, the layer of the second resist is formed of a material selected from a group of polyvinyl acetal, a mixture of polyvinyl acetal and methoxy-methylol-urea, a mixture of polyvinyl acetal and methoxy-methylol-melamine, or a mixture of methoxy-methylol-melamine and polyallyl-amine.

In another aspect of the present invention, in the method for manufacturing a semiconductor device, a solvent for the second resist is selected from pure water or a mixture of pure water and an alcohol. The solvent is capable of dissolving a base polymer and a cross-linkable compound, incapable of dissolving the first resist, and has a high solubility parameter. A liquid developer for the second resist is selected from pure water or an alkaline aqueous solution.

In another aspect of the present invention, in the method for manufacturing a semiconductor device, a solvent and a liquid developer for the second resist are selected from an organic solvent capable of dissolving the base polymer and the cross-linkable compound, incapable of dissolving the first resist, and which have a low solubility parameter.

In another aspect of the present invention, in the method for manufacturing a semiconductor device, the first resist is selected from negative type resists which are made of a mixture of a cross-linkable compound, an acid generator and a base polymer.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

BEST MODE FOR CARRYING OUT THE INVENTION

Referring to the drawings, wherein like reference numerals designate identical or corresponding parts throughout the several views, first through third embodiments of the present invention are described.

First Embodiment

Figure 1A:
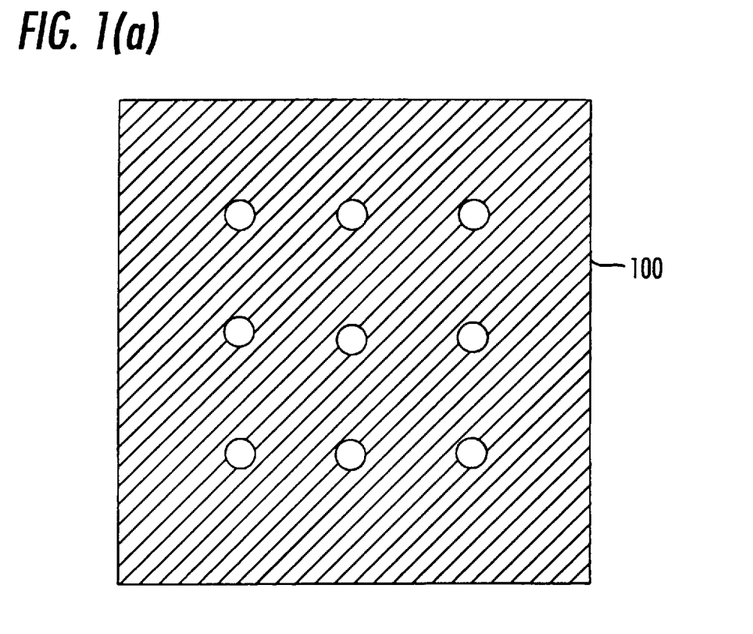
FIG. 1(a) shows a mask pattern for holes to form finely isolated resist patterns according to the present invention.
Figure 1B:
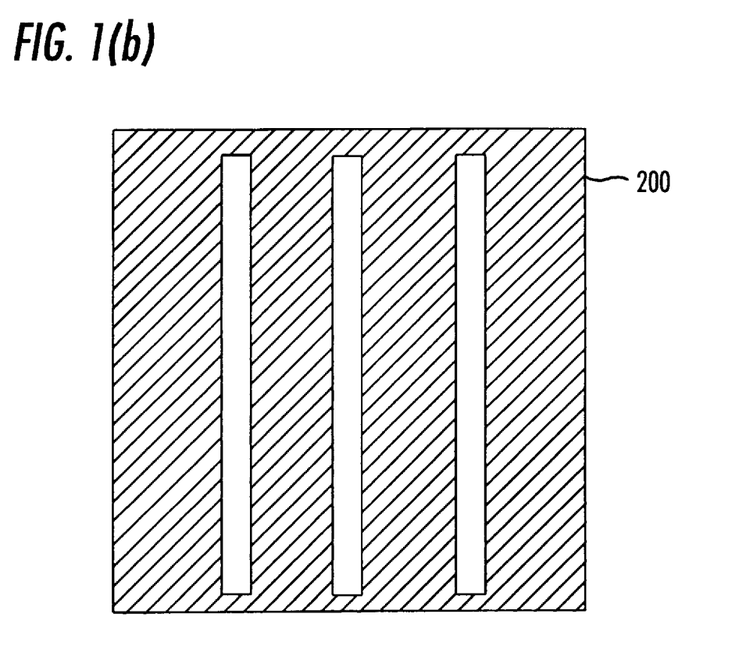
FIG. 1(b) shows a mask pattern for spaces to form finely isolated resist patterns according to the present invention.

FIGS. 1(a) and 1(b) show mask patterns used to form finely isolated resist patters to which the invention is directed. More particularly, FIG. 1(a) is a mask pattern 100 for fine holes, and FIG. 1(b) is a mask pattern 200 for fine spaces. FIGS. 2(a) to 2(f) are process flow diagrams for illustrating a method of forming a finely isolated resist pattern according to the first embodiment of the present invention. Referring to FIGS. 1(a) and 1(b), and FIGS. 2(a) to 2(f), the method for forming a finely isolated resist pattern and a method for manufacturing a semiconductor device according to the first embodiment of the invention are described.

Figure 2A:
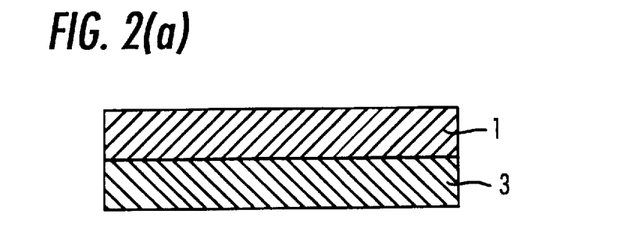
FIGS. 2(a) to 2(f) illustrate process flow for a method of forming a finely isolated resist pattern according to the first embodiment of the present invention.
Figure 2B:
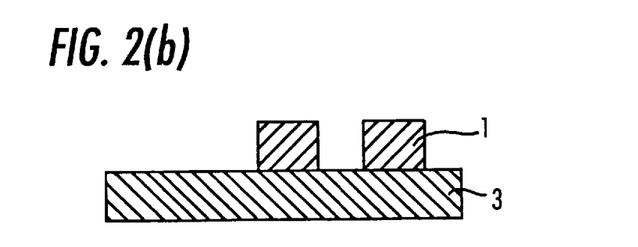

Initially, as shown in FIG. 2(a), a first photoresist 1 capable of generating an acid from the inside thereof by irradiation of light is coated on a semiconductor substrate 3 (for example, in a thickness of about 0.70 $\mu$m). The first photoresist 1 is pre-baked (by thermal treatment at 70° to 100° C. for about 1 minute), followed by exposure to light through a mask having a pattern as shown in FIG. 1(a) or 1(b), by use of a g-ray or an i-ray from a mercury lamp (e.g. for an exposure time corresponding to about 200 mJ/cm2). If required, the exposed photoresist is subjected to thermal treatment by post exposure baking (PEB) (for example, at a PEB temperature of 100° to 130° C.) thereby improving the resolution of the photoresist. This is followed by development with a diluted aqueous solution of about 2 wt % of TMAH (tetra-methyl-ammonium hydroxide). FIG. 2(b) shows the formed pattern of the resist 1.

If necessary, post developing bake may be performed (e.g. at a post-bake temperature of approximately 110° C.). This thermal treatment influences a subsequent mixing reaction and should be set at an appropriate temperature. The above procedure is similar to the formation of a resist pattern according to a known resist process except that the resist 1 capable of generating an acid is used.

Figure 2C:
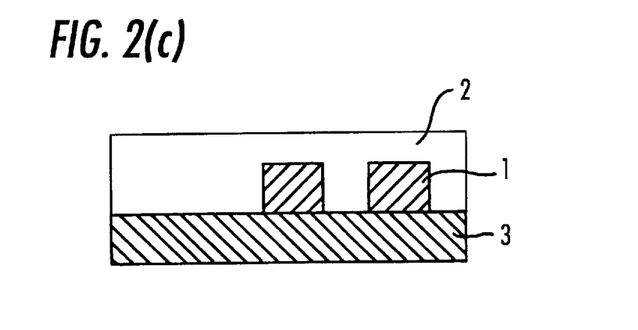

After the formation of the pattern shown in FIG. 2(b), a second resist 2, which contains a cross-linkable compound capable of cross-linking in the presence of an acid and dissolved in a solvent incapable of dissolving the first resist 1, is formed over the semiconductor substrate 3 as shown in FIG. 2(c).

It is important to note that the solvents for the second resist do not permit the pattern of the first resist to be dissolved therein. For the formation of the second resist, water (pure water), or a mixed solvent of water (pure water) and alcohol (such as isopropyl alcohol (IPA)) is used.

For the second resist, a water-soluble polyvinyl acetal may be used. Alternatively, mixtures of polyvinyl acetal and methoxy-methylol-urea, mixtures of polyvinyl acetal and methoxy-methylol-melamine, and mixtures of methoxy-methylol-melamine and polyallyl-amine may also be used. These mixtures consist of resist materials and cross-linkable compounds, or cross-linking agents.

If necessary, acrylic polymers, polyvinyl-pyrrolidone, polyvinyl alcohol and the like may be further added to the above constituent as a base polymer.

The coated second resist 2 may be pre-baked, if necessary (e.g. at about 85° C.). This thermal treatment influences a subsequent mixing reaction and should be set at an appropriate temperature.

Figure 2D:
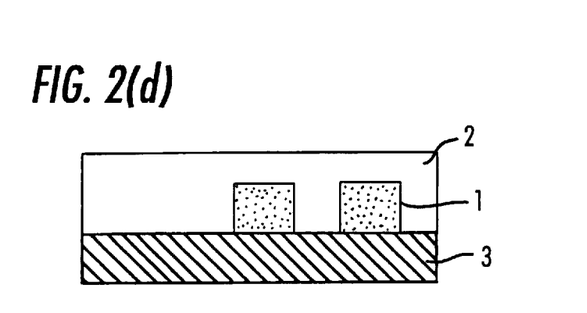

Next, as shown in FIG. 2(d), the entire surface of the semiconductor substrate 3 is exposed to a g-ray or an i-ray from a mercury lamp (e.g. an exposure time corresponding to about 200 to 1000 mJ/cm2), thereby causing an acid to be generated in the first resist 1. According to this embodiment, the substrate 3 is exposed after coating of the second resist 2 to cause the acid to be generated in the first resist 1.

It should be noted that aside from the entire exposure of the semiconductor substrate 3, the exposure may be effected using an exposure mask. The exposure mask permits selective exposure of required portions alone in such a way that the second resist is divided into areas which are cross-linked at the boundary with the first resist pattern 1 and areas which are not to be cross-linked.

Figure 2E:
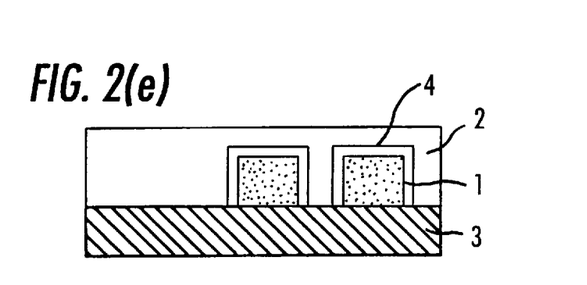

Next, as shown in FIG. 2(e), the semiconductor substrate 3 is thermally treated (at 60° to 130° C.), thereby permitting an acid to be diffused from each portion of the first resist 1 toward the second resist 2. This causes the cross-linking reaction to occur in the second resist 2 at the interfaces with the first resist 1 (e.g. mixing bake temperature/time=60° to 130° C./90 seconds). By virtue of this, a cross-linked layer 4 is formed by the cross-linking reaction in the second resist 2 to cover the first resist portions 1.

Figure 2F:
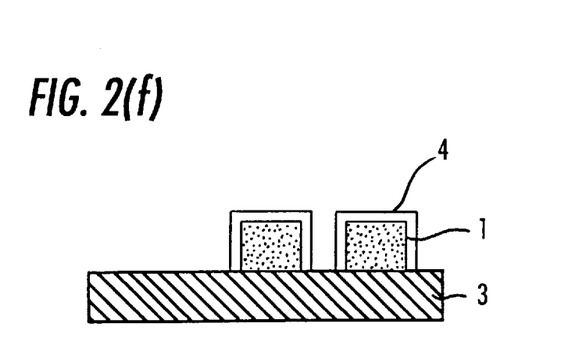

Next, as shown in FIG. 2(f), the second resist 2 is removed by development with a liquid developer, such as water or a solution of TMAH, at areas where not cross-linked. By the above treatment, it becomes possible to obtain a resist pattern which is reduced in hole diameter or isolation width. More particularly, when an isolation width in the pattern of the first resist is 0.4 $\mu$m, the second resist is coated in a thickness of 400 nm (4000 angstroms) and the cross-linked layer (mixing layer) is formed in a thickness of 0.1 $\mu$m. The resultant resist pattern, after separation of the non-cross-linked areas of the second resist, has an isolation width of 0.3 $\mu$m.

In the manufacturing method which refers to FIGS. 2(a) to 2(f), the generation of an acid from the first resist 1 by exposure to light has been described. The inventors of the present invention have found that when polyvinyl acetal is used as the second resist 2, and the patterns are thermally treated at an appropriate temperature (i.e. bake temperature), for example, of 150° C., the interfaces with the first resist pattern are cross-linked without exposure to light for the acid generation. In this case, it is preferable to use water (pure water) as the solvent.

In FIGS. 2(a) to 2(f), the pattern of finely isolated resist portions are illustrated as being formed on the semiconductor substrate 3. Needless to say, the pattern may be formed on an insulating layer such as a silicon oxide film or a conductive layer such as a poly-silicon film, depending on the manufacturing process of a semiconductor device. In short, the pattern may be formed on any other type of substrate as required. The finely isolated resist pattern formed is used as a mask to etch various types of underlying thin films, thereby forming fine spaces in the underlying thin film or fine holes to obtain a semiconductor device.

Thus, according to the invention, the first resist 1 is exposed to light as it is covered with the second resist 2, so that the amount of the acid generated in the first resist 1 can be accurately controlled by controlling the exposure. Thus, the thickness of the reaction layer 4 can be accurately controlled. The thickness of the cross-linked layer can be controlled as desired by adjusting a heating and cross-linking time (mixing bake time).

Moreover, if an appropriate exposure mask is used to selectively expose the semiconductor substrate for division into exposed areas, it becomes possible to form areas wherein the second resist pattern is cross-linked at a boundary portion with the first resist pattern. Similarly, if an appropriate exposure mask is used to selectively expose the semiconductor substrate for division into non-exposed areas, it becomes possible to form areas where no cross-linkage takes place. This permits fine holes or fine spaces of different sizes to be formed in the same semiconductor substrate.

In the practice of the invention, the solvent for the second resist 2 is one which is incapable of dissolving the first resist 1. This will facilitate the acid generated in the subsequent step to be readily diffused.

In the first embodiment of the invention, it is preferred that a novolac-based resin is used as a base material, and naphthoquinone diazide photosensitive agents are used as an acid generator to form a positive type resist from a mixture thereof. It will be noted that naphthoquinone diazide photosensitive agents are ordinarily used for the manufacturing of semiconductor devices as generating indene carboxylic acids on exposure to light. Specific examples of such agents include esters of 1,2-naphthoquinonediazido-5-sulfonic acid and hydroxy compounds. Esters of 1,2-naphthoquinonediazido-4-sulfonic acid and hydroxy compounds, which are able to provide sulfonic acid on exposure to light, may be used.

It is also preferable to utilize positive type resists, made of mixtures of novolac/naphthoquinone diazide photosensitive agents, to which triazine acid generators are added as the first resist. Examples of the triazine acid generator include trichloromethyltriazine.

Moreover, another type of positive type resist can be preferably used as the first resist. Such a positive type resist is formed of a mixture of a polyhydroxystyrene derivative as a base material and an onium salt serving as an photo-assisting acid generator. Examples of the polyhydroxystyrene derivative include esters of polyhydroxystyrene and tert-butoxycarboxylic acid.

The solvents (or solutions) for the second resist used in the first embodiment of the invention should preferably be pure water or mixed solutions of pure water and alcohol. The solvents should be able to dissolve a mixture of a base polymer and a cross-linkable compound, unable to dissolve the first resist, and have a high solubility parameter (SP). In the latter case, mixed solvents preferably contain alcohol such as isopropyl alcohol (IPA), ethyl alcohol (EtOH) and the like in amounts of not greater than 10% based on water. Because the first resist has moderate solubility parameter (SP), solvents having such a high solubility parameter (SP) are preferably used. Preferred alcohol includes isopropyl alcohol.

Alternatively, as a solvent for the second resist, it is preferable to use organic solvents which are able to dissolve mixtures of base polymers and cross-linkable compounds, unable to dissolve the first resist, and have a low solubility parameter (SP). As set out above, since the first resist 1 has a moderate solubility parameter (SP), the use of an organic solvent which exhibits low solubility parameter (SP) is effective for this purpose. Preferred examples of the organic solvent include chlorobenzene, benzene, n-hexane, cyclohexane and the like.

As for the second resist, water-soluble polyvinyl acetal is favorably used. Polyvinyl acetal is a kind of resist material which undergoes cross-linking reaction by the action of an acid. It is not necessary to add any cross-linkable compound to polyvinyl acetal since it is cross-linked by itself by means of an acid. As a matter of course, methoxy-methylol-urea or methoxy-methylol-melamine may be added to the polyvinyl acetal as a cross-linkable compound. Where polyvinyl acetal is employed to form the second resist, the cross-linking reaction takes place at the interfaces with the first resist pattern by treatment at an appropriate heating temperature. Accordingly, exposure is not necessary for the generation of an acid. In this case, as discussed above, a solvent for polyvinyl acetal may be water (pure water).

The second resist may be made of a mixture of polyvinyl acetal and methoxy-methylol-urea or methoxy-methylol-melamine. In addition, a mixture of methoxy-methylol-melamine and polyallyl-amine may also be used for the formation of the second resist. The mixtures comprise resist materials and cross-linking agents.

In general, the cross-linking agents which may be contained in the second resist include urea or melamine derivatives, such as methoxy-methylol-urea or methoxy-methylol-melamine.

As apparent from the above, the second resist which undergoes cross-linking reaction in the presence of an acid encompasses the case where a resist material itself serves as a cross-linkable compound or material. Also, the second resist which undergoes cross-linking reaction in the presence of an acid encompasses the case where a compound as a resist material and a cross-linkable compound as a cross-linking agent is mixed.

If necessary, acrylic polymers, polyvinyl pyrrolidone and polyvinyl alcohol may be added as a base polymer.

The formation of a resist pattern wherein the first resist is of the positive type has been described hereinabove. In the first embodiment, the first resist is not limited to the positive type. A negative tone resist may also be used and is within the scope of the invention. The negative tone resist, utilized in the practice of the invention, may constitute mixtures comprising, for example, cross-linkable compounds including melamine derivatives such as methoxy-methylol-urea or methoxy-methylol-melamine, organic halogen-based acid generators, and base polymers such as polyhydroxystyrene, novolac resin and the like.

Second Embodiment

FIGS. 3(a) to 3(e) are flow diagrams illustrating a method of forming a finely isolated resist pattern according to the second embodiment of the present invention. With reference to FIGS. 1(a), 1(b), and FIGS. 3(a) to 3(e), the method of forming a finely isolated resist pattern, and a method for manufacturing a semiconductor device using the resist pattern are described according to the second embodiment.

Figure 3A:
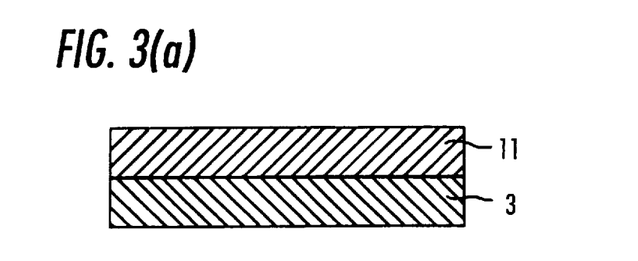
FIGS. 3(a) to 3(e) illustrate process flow for a method of forming a finely isolated resist pattern according to the second embodiment of the present invention.
Figure 3B:
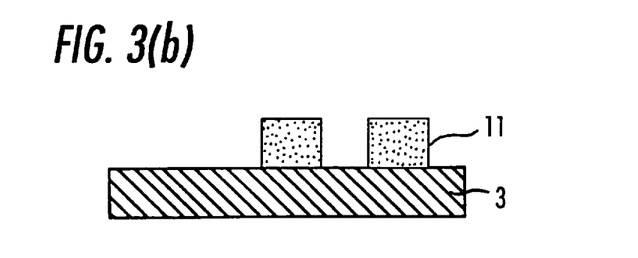

As shown in FIG. 3(a), a first photoresist 11 containing a small amount of an acidic material therein is coated on a semiconductor substrate 3. The first photoresist 1 is pre-baked (by thermal treatment at a temperature of 70° to 100° C.), followed by exposure of the pre-baked photoresist 1 to a g-ray or an i-ray from a mercury lamp via a mask having such a pattern as shown in FIG. 1(a) or 1(b). FIG. 3(b) shows a pattern 11 of the first resist formed after the step of FIG. 3(a).

If necessary, the resist pattern is thermally treated by means of post exposure baking (at a temperature of 100° to 130° C.) to improve the resolution of the photoresist, followed by development with a diluted aqueous solution of about 20% of TMAH (tetra-methyl-ammonium hydroxide).

Next, if necessary, post developing bake may be performed. This thermal treatment influences a subsequent mixing reaction and should be set at an appropriate temperature. These steps are similar to those of forming a resist pattern according to a known resist-forming process except that the resist containing an acid is used in the practice of the present invention.

Figure 3C:
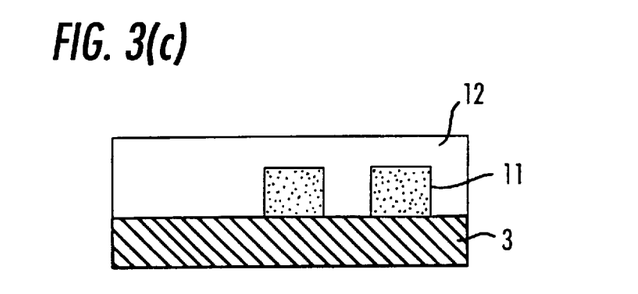

After the formation of the pattern shown in FIG. 3(b), a second resist 12, which contains a cross-linkable compound capable of cross-linking in the presence of an acid and which is dissolved in a solvent incapable of dissolving the first resist 11, is formed over the semiconductor substrate (wafer) 3 as shown in FIG. 3(c).

It is important that the solvents for the second resist do not dissolve the pattern of the first resist. The solvents for the second resist are, for example, water (pure water) or a mixed solvent of water (pure water), and an alcohol such as isopropyl alcohol.

Like the first embodiment, water-soluble polyvinyl acetal is used as the second resist 12 in this embodiment. Moreover, a mixture of polyvinyl acetal and methoxy-methylol-urea or methoxy-methylol-melamine, along with a mixture of methoxy-methylol-melamine and polyallyl-amine, may be used as the second resist. These mixtures consist of resist materials and cross-linkable compounds, or cross-linking agents. In general, the cross-linking agents contained in the second resist include melamine derivatives, such as methoxy-methylol-melamine.

If necessary, acrylic polymers, polyvinyl pyrrolidone and polyvinyl alcohol may be further added as a base polymer, like the first embodiment.

After formation of the second resist 12, this resist may be pre-baked, if necessary. This thermal treatment influences a subsequent mixing reaction and should be set at an appropriate temperature.

Figure 3D:
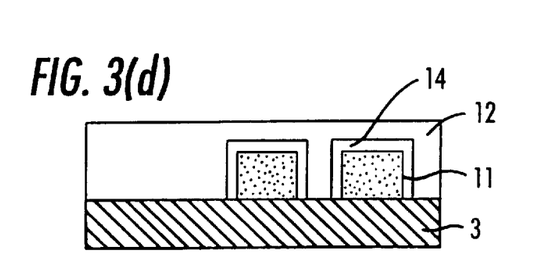

Subsequently, as shown in FIG. 3(d), the semiconductor substrate 3 is thermally treated (at 60° to 130° C.), so that the acidic substance contained in small amounts in the first resist 11 is diffused. This causes the cross-linking reaction to occur in the second resist 12 in the vicinity of interfaces with the first resist portions 11. By this, a cross-linked layer 14 is formed in the second resist 12, covering the first resist 11.

Figure 3E:
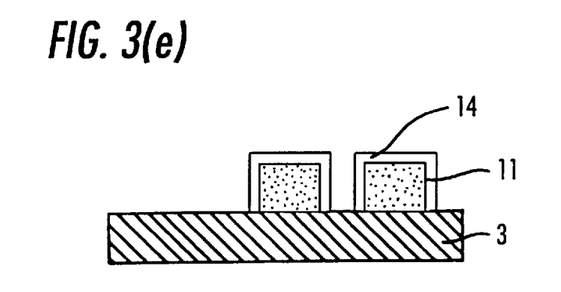

Then, as shown in FIG. 3(e), the portions of the second resist 12 not cross-linked, are removed by development with a liquid developer, such as water or a solution of TMAH. Thus, it becomes possible to obtain a resist pattern which has a reduced hole diameter or isolation width.

As will be apparent from the foregoing, in accordance with the second embodiment of the present invention, since a solvent incapable of dissolving the first resist 11 is used for the formation of the second resist 12, the acid generated through the subsequent thermal treatment is permitted to readily diffuse into the second resist.

The first resist 11 used in the second embodiment does not need any exposure for generating an acid but, is arranged to have an acid incorporated in the resist film 11. The resist film is thermally treated to cause the acid to be diffused for cross-linking. The acids incorporated in the first resist are preferably low molecular weight carboxylic acids.

It should be noted that the materials for the first resist and the second resist, defined with respect to the first embodiment, may also be used in the second embodiment.

The formation of finely isolated spaces or fine holes in a semiconductor substrate, by forming this type of finely isolated resist pattern on various types of semiconductor substrates as a mask, is feasible in a manner as set out in the first embodiment.

Third Embodiment

FIGS. 4(a) to 4(g) are flow diagrams for illustrating a method of forming a finely isolated resist pattern according to a third embodiment of the present invention. Referring to FIGS. 1(a), 1(b), and FIGS. 4(a) to 4(g), the method for forming a finely isolated resist pattern and a method for manufacturing a semiconductor device using the resist pattern, according to the third embodiment are described.

Figure 4A:
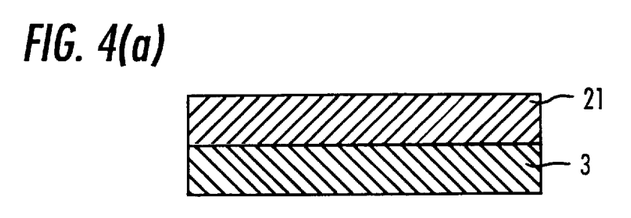
FIGS. 4(a) to 4(g) illustrate process flow for a method of forming a finely isolated resist pattern according to the third embodiment of the present invention.
Figure 4B:
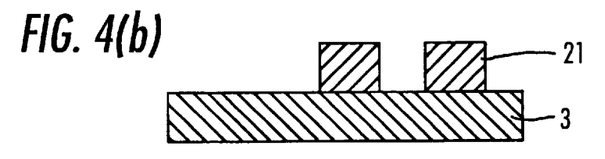

As shown in FIG. 4(a), a first photoresist 21 is formed on a semiconductor substrate 3. After pre-baking of the first photoresist 21 (by thermal treatment at 70° C. to 100° C. for about 1 minute), the photoresist 21 is exposed to a g-ray or an i-ray from a mercury lamp, via a mask, having a pattern as shown in FIG. 1(a) or 1(b). If necessary, the photoresist is thermally treated by post exposure baking (at 100° C. to 130° C.) to improve the resolution thereof, followed by development with a diluted aqueous solution of about 2.0 wt % of TMAH (tetra-methyl-ammonium hydroxide). FIG. 4(b) shows the resultant pattern 21 of the first resist.

Thereafter, post developing bake may be performed, if necessary. This thermal treatment influences a subsequent mixing reaction and should be effected at an appropriate temperature. These steps are similar to those of forming a resist pattern according to a known resist-forming process.

Figure 4C:
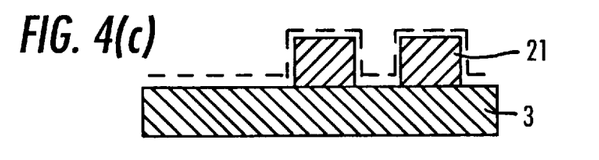
Figure 4D:
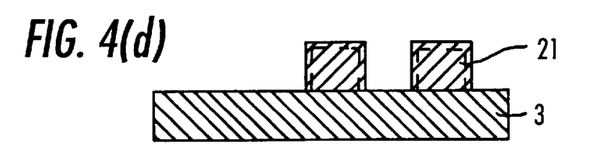

After the formation of the pattern shown in FIG. 4(b), the semiconductor substrate (wafer) 3 is applied with an acidic solution as shown in FIG. 4(c). This application may be effected by an ordinary paddle development procedure. Alternatively, the acidic solution may be sprayed. Either organic acids or inorganic acids may be used for the acidic solution. Preferably, acetic acid of low concentration is used. In this step, the acid is soaked in the surfaces of the first resist pattern 21 to form a thin layer containing the acid therein. Thereafter, the surfaces are rinsed with pure water as shown in FIG. 4(d).

Figure 4E:
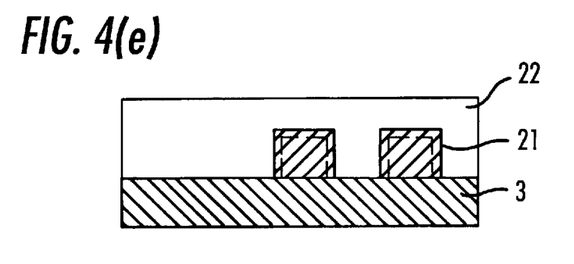

Afterwards, as shown in FIG. 4(e), a second resist 22, containing a cross-linkable compound capable of cross-linking in the presence of an acid and dissolved in a solvent incapable of dissolving the first resist 21, is applied onto the first resist pattern 21.

It is important that the solvents for the second resist do not dissolve the first resist pattern. The solvents include, for example, water (pure water) or a mixed solvent of water (pure water) and an alcohol such as isopropyl alcohol.

Like the foregoing embodiments, polyvinyl acetal is used as the second resist. Polyvinyl acetal is a resist material which undergoes cross-linking reaction by the action of an acid. Alternatively, the second resist may be made of a mixture of polyvinyl acetal and methoxy-methylol-urea or methoxy-methylol-melamine, or a mixture of methoxy-methylol-melamine and polyallyl-amine. These mixtures consists of a resist material and a cross-linking material.

In general, the cross-linking agents contained in the second resist may be melamine derivatives, such as methoxy-methylol-melamine.

If necessary, acrylic polymers, polyvinyl pyrrolidone and polyvinyl alcohol may be further added as a base polymer.

After coating of the second resist 22, it may be pre-baked, if necessary. This thermal treatment influences a subsequent mixing or cross-linking reaction, and should be effected at an appropriate temperature.

Figure 4F:
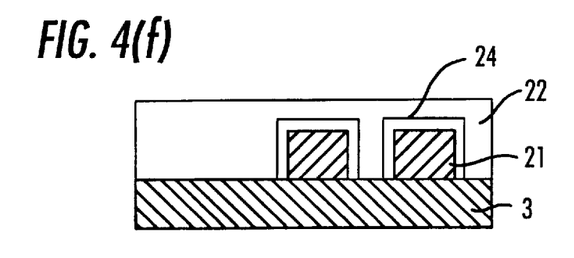

Then, as shown in FIG. 4(f), the semiconductor substrate 3 is baked at 60° to 130° C. This causes a cross-linking reaction to proceed in the vicinity of the interfaces between the second resist 22 and the first resist 21 in the presence of an acid from the first resist 21. As a result, a cross-linked layer 4 is formed in the second resist 22, covering each portion of the resist 21 therewith.

Figure 4G:
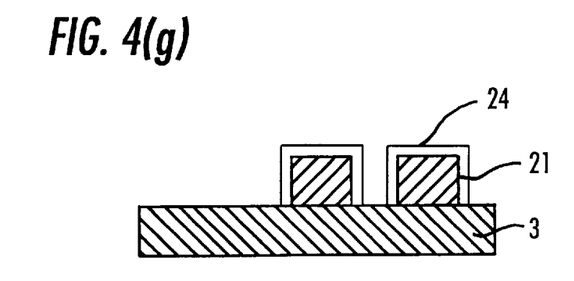

Next, as shown in FIG. 4(g), the portions of the second resist 22 which have not been cross-linked are removed by development with a liquid developer, such as water or a solution of TMAH. The resultant resist pattern has a reduced hole diameter or isolation width.

According to the third embodiment of the invention, any step of generating an acid in the first resist by exposure to light is not necessary. In this embodiment, the first resist is surface treated with an acidic solution prior to the formation of the second resist film. Then, it is thermally treated to permit the acid to be diffused, thereby causing the cross-linking in the second resist.

In the third embodiment, the first photoresist 21 may be positive type resists formed of novolac/naphtho-quinone diazides, or mixtures of para-hydroxy-styrene derivatives and photo-assisting acid generators, such as onium salts as used in the first embodiment.

Other materials for the first resist and the second resist, set out in the first embodiment, may be likewise used in the third embodiment.

The formation of finely isolated spaces or fine holes in a semiconductor substrate, by forming this type of finely isolated resist pattern on various types of semiconductor substrates as a mask, is feasible in a manner as set out in the first embodiment.

As has been described above in detail, according to the present invention, there is provided a method for forming a finely isolated resist pattern which enables one to form fine patterns, such as fine isolated patterns or hole patterns, which exceed the wavelength limit. As a result, hole patterns of a resist having a hole diameter smaller than in the conventional art, or space patterns of a resist having an isolation width smaller than in the conventional art, may be formed.

Using the finely isolated resist pattern thus formed as a mask, finely isolated spaces or holes can be formed in semiconductor substrates. Moreover, when using such a method as described above, there can be obtained semiconductor devices having spaces or holes which are finely isolated from one another.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method for manufacturing a semiconductor device, comprising the steps of:
   forming a pattern of a first resist on a substrate or on a semiconductor device layer formed on a substrate;
   forming, over said first resist, a layer of a second resist, undergoing a cross-linking reaction in the presence of an acid;
   exposing the substrate to light after forming the second resist layer, thereby generating an acid in the first resist layer;
   forming a cross-linked film in portions of said second resist, which are in contact with said first resist, by action of an acid from said first resist;
   removing non-cross-linked portions of said second resist thereby forming a resist pattern;
   and etching said substrate or said semiconductor device layer via a mask of said resist pattern.

2. A method for manufacturing a semiconductor device according to claim 1, wherein said pattern of the first resist and said layer of the second resist are heated to form said cross-linked film.

3. The method for manufacturing a semiconductor device according to claim 1, wherein an acid is generated in the first resist by exposure to a g-ray or an i-ray from a mercury lamp.

4. A method for manufacturing a semiconductor device according to claim 3, wherein said pattern of said first resist is selectively exposed to light only in a predetermined area thereof.

5. A method for manufacturing a semiconductor device according to claim 1, wherein said pattern of the first resist is formed of a mixture comprising a novolac-based resin and a naphtho-quinone diazide photosensitive agent.

6. A method for manufacturing a semiconductor device according to claim 5, wherein said pattern of said first resist further comprises a chloro-methyl-triazine as an acid generator.

7. A method for manufacturing a semiconductor device according to claim 1, wherein said pattern of said first resist is formed of a mixture comprising a poly-hydroxy-styrene derivative and an onium salt serving as an photo-assisted acid generator.

8. A method for manufacturing a semiconductor device according to claim 1, wherein said layer of said second resist is formed of a resist which comprises a cross-linking agent, undergoing cross-linking reaction in the presence of an acid.

9. A method for manufacturing a semiconductor device according to claim 1, wherein said layer of the second resist is formed of a material selected from a group of polyvinyl acetal, a mixture of polyvinyl acetal and methoxy-methylol-urea, a mixture of polyvinyl acetal and methoxy-methylol-melamine, or a mixture of methoxy-methylol-melamine and polyallyl-amine.

10. A method for manufacturing a semiconductor device according to claim 1, wherein a solvent for said second resist is selected from pure water, or a mixture of pure water and an alcohol, which can dissolve a base polymer and a cross-linkable compound, and which cannot dissolve said first resist, and which have a high solubility parameter, and a liquid developer for said second resist is selected from pure water or an alkaline aqueous solution.

11. A method for manufacturing a semiconductor device according to claim 1, wherein a solvent for said second resist and a liquid developer for said second resist are selected from an organic solvent which can dissolve the base polymer and the cross-linkable compound, and which cannot dissolve said first resist, and which have a low solubility parameter.

12. A method for manufacturing a semiconductor device according to claim 1, wherein said first resist is selected from negative type resists which are made of a mixture of a cross-linkable compound, an acid generator and a base polymer.

13. A semiconductor device manufactured by said method of manufacturing a semiconductor device according to claim 1.

14. A method for manufacturing a semiconductor device, comprising the steps of:
   forming a pattern of a first resist on a substrate or on a semiconductor device layer;
   forming, over said first resist, a layer of a second resist, undergoing a cross-linking reaction in the presence of an acid;
   forming a cross-linked film in portions of said second resist, which are in contact with said first resist, by action of an acid from said first resist under heat treatment;

removing non-cross-linked portions of said second resist thereby forming a resist pattern;

and etching said substrate or said semiconductor device layer via a mask of said resist pattern.

15. A method for manufacturing a semiconductor device according to claim 14, wherein said pattern of the first resist is formed of a mixture comprising a novolac-based resin and a naphtho-quinone diazide photosensitive agent.

16. A method for manufacturing a semiconductor device according to claim 15, wherein said pattern of said first resist further comprises a chloro-methyl-triazine as an acid generator.

17. A method for manufacturing a semiconductor device according to claim 14, wherein said pattern of said first resist is formed of a mixture comprising a poly-hydroxy-styrene derivative and an onium salt serving as a photo-assisted acid generator.

18. A method for manufacturing a semiconductor device according to claim 14, wherein said layer of said second resist is formed of a resist which comprises a cross-linking agent, undergoing cross-linking reaction in the presence of an acid.

19. A method for manufacturing a semiconductor device according to claim 14, wherein said layer of the second resist is formed of a material selected from a group of polyvinyl acetal, a mixture of polyvinyl acetal and methoxy-methylol-urea, a mixture of polyvinyl acetal and methoxy-methylol-melamine, or a mixture of methoxy-methylol-melamine and polyallyl-amine.

20. A method for manufacturing a semiconductor device according to claim 14, wherein said first resist is selected from negative type resists which are made of a mixture of a cross-linkable compound, an acid generator and a base polymer.

21. A method for manufacturing a semiconductor device according to claim 14, wherein a solvent for said second resist is selected from pure water or a mixture of pure water and an alcohol which can dissolve a base polymer and a cross-linkable compound, and which cannot dissolve said first resist, and which have a high solubility parameter, and a liquid developer for said second resist is selected from pure water or an alkaline aqueous solution.

22. A method for manufacturing a semiconductor device according to claim 14, wherein a solvent for said second resist and a liquid developer for said second resist are selected from an organic solvent which can dissolve the base polymer and the cross-linkable compound, and which cannot dissolve said first resist, and which have a low solubility parameter.

23. A method for manufacturing a semiconductor device, comprising the steps of:

forming a pattern of a first resist on a substrate or on a semiconductor device layer;

forming, over said first resist, a layer of a second resist, undergoing a cross-linking reaction in the presence of an acid;

forming a cross-linked film in portions of said second resist, which are in contact with said first resist, by action of an acid from said first resist under heat treatment;

removing non-cross-linked portions of said second resist thereby forming a resist pattern;

and etching said substrate or said semiconductor device layer via a mask of said resist pattern; wherein said pattern of the first resist is formed of a resist which is surface-treated with an acidic liquid.

24. A method for manufacturing a semiconductor device according to claim 23, wherein said pattern of the first resist is formed of a mixture comprising a novolac-based resin and a naphtho-quinone diazide photosensitive agent.

25. A method for manufacturing a semiconductor device according to claim 24, wherein said pattern of said first resist further comprises a chloro-methyl-triazine as an acid generator.

26. A method for manufacturing a semiconductor device according to claim 23 wherein said pattern of said first resist is formed of a mixture comprising a poly-hydroxy-styrene derivative and an onium salt serving as a photo-assisted acid generator.

27. A method for manufacturing a semiconductor device according to claim 23, wherein said layer of said second resist is formed of a resist which comprises a cross-linking agent, undergoing cross-linking reaction in the presence of an acid.

28. A method for manufacturing a semiconductor device according to claim 23, wherein said layer of the second resist is formed of a material selected from a group of polyvinyl acetal, a mixture of polyvinyl acetal and methoxy-methylol-urea, a mixture of polyvinyl acetal and methoxy-methylol-melamine, or a mixture of methoxy-methylol-melamine and polyallyl-amine.

29. A method for manufacturing a semiconductor device according to claim 23, wherein said first resist is selected from negative type resists which are made of a mixture of a cross-linkable compound, an acid generator and a base polymer.

30. A method for manufacturing a semiconductor device according to claim 23, wherein a solvent for said second resist is selected from pure water or a mixture of pure water and an alcohol which can dissolve a base polymer and a cross-linkable compound, and which cannot dissolve said first resist, and which have a high solubility parameter, and a liquid developer for said second resist is selected from pure water or an alkaline aqueous solution.

31. A method for manufacturing a semiconductor device according to claim 23, wherein a solvent for said second resist and a liquid developer for said second resist are selected from an organic solvent which can dissolve the base polymer and the cross-linkable compound, and which cannot dissolve said first resist, and which have a low solubility parameter.

* * * * *